US012528000B1

(12) United States Patent
Schmidt et al.

(10) Patent No.: US 12,528,000 B1
(45) Date of Patent: Jan. 20, 2026

(54) BALL BATS AND SYSTEMS AND METHODS FOR MAKING BALL BATS

(71) Applicant: RAWLINGS SPORTING GOODS COMPANY, INC., St. Louis, MO (US)

(72) Inventors: Marc Schmidt, Weldon Spring, MO (US); Nicole McLeod, Augusta, MO (US)

(73) Assignee: RAWLINGS SPORTING GOODS COMPANY, INC., St. Louis, MO (US)

( * ) Notice: Subject to any disclaimer, the term of this patent is extended or adjusted under 35 U.S.C. 154(b) by 884 days.

(21) Appl. No.: 17/663,567

(22) Filed: May 16, 2022

Related U.S. Application Data

(60) Provisional application No. 63/189,526, filed on May 17, 2021.

(51) Int. Cl.
*A63B 59/58* (2015.01)
*A63B 102/18* (2015.01)
*G06F 30/12* (2020.01)

(52) U.S. Cl.
CPC .............. *A63B 59/58* (2015.10); *G06F 30/12* (2020.01); *A63B 2102/18* (2015.10); *A63B 2102/182* (2015.10)

(58) Field of Classification Search
CPC ................ A63B 59/58; A63B 2102/18; A63B 2102/182; G06F 30/12
See application file for complete search history.

(56) References Cited

U.S. PATENT DOCUMENTS

| | | | | |
|---|---|---|---|---|
| 5,785,614 | A * | 7/1998 | MacKay, Jr. | A63B 60/10 473/566 |
| 6,398,675 | B1 * | 6/2002 | Eggiman | A63B 59/50 473/566 |
| 10,948,898 | B1 * | 3/2021 | Pietrzak | B33Y 50/02 |
| 2002/0091022 | A1 * | 7/2002 | Fritzke | A63B 59/51 473/566 |

(Continued)

FOREIGN PATENT DOCUMENTS

| | | | | |
|---|---|---|---|---|
| CN | 105666053 A * | 6/2016 | | B23P 15/00 |
| JP | H0568570 U * | 9/1993 | | |

OTHER PUBLICATIONS

JP-H0568570-U Merged Translation (Year: 1993).*

(Continued)

*Primary Examiner* — Jeffrey S Vanderveen
(74) *Attorney, Agent, or Firm* — Perkins Coie LLP

(57) ABSTRACT

Representative embodiments of the present technology include a ball bat in which part of an inner surface of the bat wall has a contoured region including a plurality of radially inwardly curving portions and a plurality of radially outwardly curving portions. In some embodiments, the contoured region is asymmetric relative to a longitudinal center location of the contoured region. In some embodiments, the curving portions are unevenly distributed along the length of the contoured region. In some embodiments, a method of manufacturing a ball bat includes generating a simulated body within a simulation region, the body having a starting geometry that is modified to include less material (less mass) while conforming to displacement limits associated with loads at specified loading locations, among other variables.

17 Claims, 10 Drawing Sheets

(56) References Cited

U.S. PATENT DOCUMENTS

| | | | | |
|---|---|---|---|---|
| 2003/0013543 A1* | 1/2003 | Helmstetter | A63B 60/00 | 473/345 |
| 2006/0063620 A1* | 3/2006 | Page | A63B 59/50 | 473/568 |
| 2007/0254752 A1* | 11/2007 | Sutherland | A63B 59/50 | 473/564 |
| 2014/0329615 A1* | 11/2014 | Roberts | A63B 60/54 | 473/332 |
| 2018/0250565 A1* | 9/2018 | Wiese | A63B 59/50 | |

OTHER PUBLICATIONS

CN-105666053-A Merged Translation (Year: 2016).*

Callaway, “Epic Flash Driver”, URL: https://www.callawaygolf.com/drivers-product-videos-epic-flash-commercial.html, Feb. 12, 2019.

Demarini, “2021 Gattaca (−3) BBCOR Baseball Bat”, URL: https://www.demarini.com/en-us/product/2021-gattaca-3-bbcor-baseball-bat-wbd2289#axis=56216, web page visited May 30, 2022.

Marucci Sports, “CAT9 BBCOR Baseball Bat”, URL: https://maruccisports.com/cat9-bbcor/, web page visited May 30, 2022.

* cited by examiner

1100

1105 1110

| Maximum Wall Thickness t (inches) | Extent of Contoured Region (distance L) (inches) |
|---|---|
| 0.209 | 2.373 |
| 0.200 | 2.373 |
| 0.190 | 2.373 |
| 0.180 | 2.373 |
| 0.170 | 2.373 |
| 0.200 | 2.293 |
| 0.200 | 1.544 |
| 0.200 | 3.13 |
| 0.200 | 3.48 |
| 0.216 | 2.338 |
| 0.210 | 2.338 |
| 0.216 | 3.543 |

*FIG. 11*

BALL BATS AND SYSTEMS AND METHODS FOR MAKING BALL BATS

CROSS-REFERENCE TO RELATED APPLICATION(S)

The present application claims priority to U.S. Provisional Patent Application No. 63/189,526, filed May 17, 2021, which is incorporated herein by reference in its entirety.

BACKGROUND

There are challenges in making an effective and durable baseball or softball bat that meets league or association rules. For example, some leagues or associations have rules that limit the Bat-Ball Coefficient of Restitution (BBCOR), the Batted Ball Speed (BBS), or other rules associated with the collision efficiency between a bat and a ball. These rules are generally intended to limit performance of the bat to reduce the risk of injury from batted balls. Bat designers seek to maximize effectiveness and durability of ball bats while complying with various rules.

SUMMARY

Representative embodiments of the present technology include a ball bat in which part of an inner surface of the bat wall has a contoured region including a plurality of radially inwardly curving portions and a plurality of radially outwardly curving portions. In some embodiments, the contoured region is asymmetric relative to a longitudinal center location of the contoured region. In some embodiments, the curving portions are unevenly distributed along the length of the contoured region. In some embodiments, a method of manufacturing a ball bat includes generating a simulated body within a simulation region, the body having a starting geometry that is modified to include less material (less mass) while conforming to displacement limits associated with loads at specified loading locations, among other variables.

Other features and advantages will appear hereinafter. The features described herein can be used separately or together, or in various combinations of one or more of them.

BRIEF DESCRIPTION OF THE DRAWINGS

In the drawings, wherein the same reference number indicates the same element throughout the views:

FIG. 11 illustrates a chart of dimensions for various ball bats configured in accordance with embodiments of the present technology.

DETAILED DESCRIPTION

Figure 1:
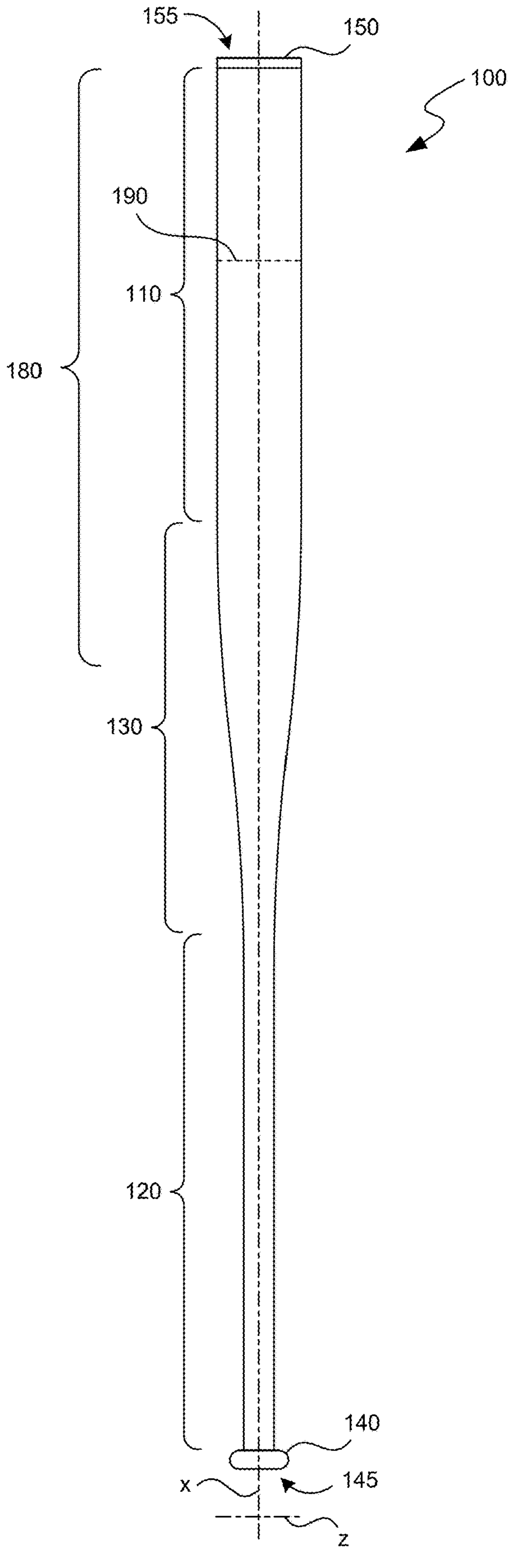
FIG. 1 illustrates a side view of a ball bat configured in accordance with embodiments of the present technology.

The present technology is directed to ball bats, and systems and methods for designing ball bats. Various embodiments of the technology will now be described. The following description provides specific details for a thorough understanding and enabling description of these embodiments. One skilled in the art will understand, however, that the invention may be practiced without many of these details. Additionally, some well-known structures or functions, such as those common to ball bats (such as baseball or softball bats) and materials suitable for use in ball bats (such as metal materials, composite materials, or other suitable materials), may not be shown or described in detail to avoid unnecessarily obscuring the relevant descriptions of the various embodiments. Accordingly, embodiments of the present technology may include additional elements or exclude some of the elements described below with reference to FIGS. 1-11, which illustrate examples of the technology.

The terminology used in this description is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section.

Where the context permits, singular or plural terms may also include the plural or singular term, respectively. Moreover, unless the word “or” is expressly limited to mean only a single item exclusive from the other items in a list of two or more items, then the use of “or” in such a list is to be interpreted as including (a) any single item in the list, (b) all of the items in the list, or (c) any combination of items in the list. Further, unless otherwise specified, terms such as “attached” or “connected” are intended to include integral connections, as well as connections between physically separate components. For purposes of the present disclosure, a first element that is positioned “toward” an end of a second element is positioned closer to that end of the second element than to a middle or mid-length location of the second element.

As generally illustrated in the Figures and described herein, ball bats configured in accordance with embodiments of the present technology may include variable wall thickness along at least a portion of their length. For example, the ball bats may have contoured surfaces on the inwardly facing side of the bat wall, such that the contoured surfaces provide varying thickness of the bat wall. The contours can include regular or irregular patterns of peaks, valleys, inflection points between the peaks and valleys, consistent or flat regions, or other contour features. Systems and methods for designing ball bats can include iterative design processes assisted with a computer or other processor configured to specify shapes (for example, shapes of bat walls) based on parameters. A user may select and test the bats to determine the preferred characteristics. Configurations of such bats may provide performance within league or association regulations while reducing weight (for example, minimizing weight).

As shown in FIG. 1, a baseball or softball bat 100, herein collectively referred to as a "ball bat" or "bat," includes a barrel portion 110, a handle portion 120, and a tapered section 130 joining the handle portion 120 to the barrel portion 110 along a longitudinal axis x. The tapered section 130 transitions the larger diameter of the barrel portion 110 to the narrower diameter of the handle portion 120. The tapered section 130 may include parts of the barrel portion 110 or the handle portion 120, such that the barrel portion 110 is attached to, or continuous with, the handle portion 120. The handle portion 120 optionally includes a knob 140 or similar structure positioned at a proximal end 145 of the bat 100. An optional end cap 150 or other suitable plug may close off the barrel portion 110 at a distal end 155 of the bat 100 (for purposes of this disclosure, the "distal end" is the end of an embodiment farthest from a user).

The interior of the bat 100 may be hollow, allowing the bat 100 to be relatively lightweight so that ball players may generate substantial bat speed when swinging the bat 100. A hitting surface or ball striking area 180 of the bat 100 typically extends throughout the length of the barrel portion 110, and may extend partially into the tapered section 130 of the bat 100. The bat 100 generally includes a "sweet spot" 190, which is the impact location where the transfer of energy from the bat 100 to a ball is generally maximal, while the transfer of energy to a player's hands is generally minimal. The sweet spot 190 is typically located near the center of percussion (COP) of the bat within the barrel portion 110, the location of which may be determined by the ASTM F2398-11 Standard. For ease of measurement and description in the present application, the sweet spot 190 described herein coincides with the bat's COP.

The proportions of the bat 100, such as the relative sizes of the barrel portion 110, the handle portion 120, and the tapered section 130, are not drawn to scale and may have any relative proportions suitable for use in a ball bat. Accordingly, the bat 100 may have any suitable dimensions. For example, the bat 100 may have an overall length of 20 to 40 inches, or 26 to 34 inches. The overall barrel portion 110 diameter may be 2.0 to 3.0 inches, or 2.25 to 2.75 inches. Typical ball bats have barrel diameters of 2.25, 2.625, or 2.75 inches. Bats having various combinations of these overall lengths and barrel diameters, or any other suitable dimensions, are contemplated herein. The specific preferred combination of bat dimensions is generally dictated by the user of the bat 100, and may vary greatly among users. For purposes of orientation and context for the description herein, FIG. 1 also illustrates a radial z-axis. The z-axis is orthogonal to the longitudinal x-axis and extends radially through the wall thickness of the bat 100.

Components of the bat 100 may be constructed from one or more composite or metallic materials. Some examples of suitable composite materials include laminate layers or plies reinforced with fibers of carbon, glass, graphite, boron, aramid (such as Kevlar®), ceramic, or silica (such as Astroquartz®). Suitable metallic materials include aluminum, titanium, or another metallic material.

For convenience of description and to assist the reader with understanding embodiments of the present technology, portions of ball bats formed according to embodiments of the technology are described below, followed by systems and methods of making such ball bats.

Figure 2:
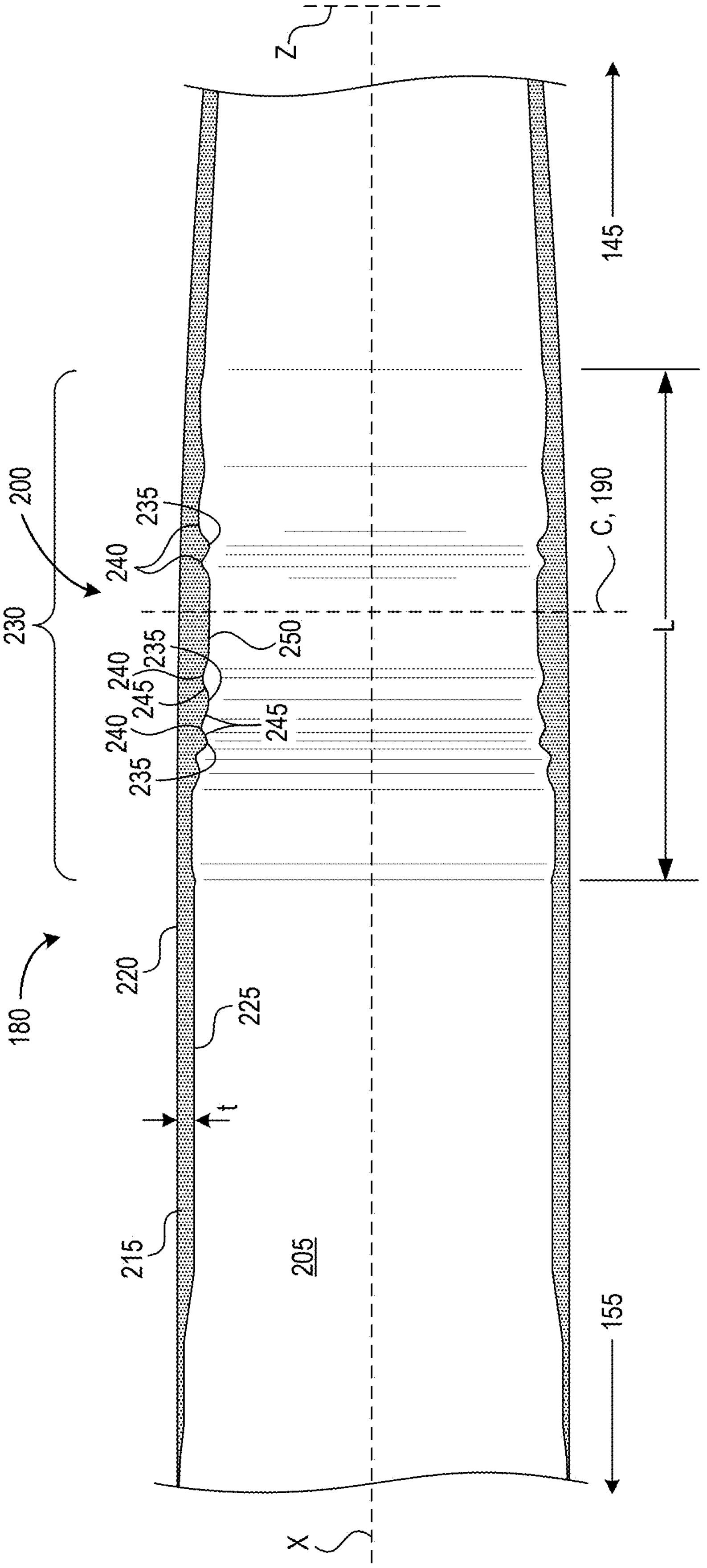
FIG. 2 illustrates a side cross-sectional view of a portion of a ball bat configured in accordance with embodiments of the present technology.

FIG. 2 illustrates a cross-sectional view of a portion of a bat 200 configured in accordance with embodiments of the present technology. The illustrated section in FIG. 2 may include at least a portion of the ball striking area 180 (see FIG. 1). The bat 200 includes a hollow interior region 205 positioned within a bat wall 215. An outer surface 220 of the bat wall 215 may form an outer surface of the bat 200 for striking a ball, such that at least a portion of the outer surface 220 may have a generally continuous contour similar to conventional ball bats. The bat wall 215 may have a thickness t that varies along the longitudinal axis x.

In some embodiments, an inner surface 225 of the bat wall 215 may include a contoured region 230 with a plurality of radially inwardly curving portions 235 (which may be called peaks, although they may be rounded or pointed), a plurality of radially outwardly curving portions 240 (which may be called valleys), and inflection points 245 between the curving portions 235, 240. In some embodiments, the contoured region 230 may include one or more straight sections 250 in which the inner surface 225 is neither curving radially inwardly nor curving radially outwardly. For simplicity in illustration, only some curving portions 235, 240, inflection points 245, and straight sections 250 are labeled.

The curving portions 235, 240 may have varying radial dimensions (in other words, the bat wall 215 may have variable thickness) such that one or more radially inwardly curving portions 235 are larger than one or more other radially inwardly curving portions 235, or one or more radially outwardly curving portions 240 are deeper into the bat wall 215 than one or more other radially outwardly curving portions 240. In other words, curving portions 235, 240 or groups of curving portions 235, 240 may be differently shaped and sized from each other, such that the contoured region 230 is non-uniform along the longitudinal axis x.

The inflection points 245 transition the curving portions 235, 240 between radially inwardly directions and radially outwardly directions. In some embodiments, there may be ten or more inflection points 245 within the contoured region 230. In other embodiments, there may be fewer than ten inflection points 245 within the contoured region 230. A greater amount of inflection points enables a higher degree of tuning for the selected or desired parameters of the ball bat. Like the curving portions 235, 240, the inflection points 245 may be unevenly distributed (variably spaced) along the longitudinal axis x within the contoured region 230. One or more inflection points 245 may be positioned at different radial locations (along the radial z-axis) than other inflection points 245, such that the inflection points 245 are variably distributed along the radial z-axis.

In some embodiments, the contoured region 230 may extend along only a portion of the ball striking area 180, such that other portions of the bat wall 215 outside of the contoured region 230 have generally uniform or consistent thickness t or otherwise do not include peaks or valleys. For example, in some embodiments, the contoured region 230 may extend along the longitudinal axis x by a distance L. The distance L may range between 1.5 inches and 4.0 inches, and the wall thickness t may range between 0.09 inches and 0.25 inches, or other suitable dimensions may be used. In some embodiments, the contoured region 230 may extend along the longitudinal axis x by a distance L that is greater than 4.0 inches, such as along at least half of the barrel portion 110, more than half of the barrel portion 110, or all of the barrel portion 110 (optionally excluding a part of the barrel portion 110 that is longitudinally aligned with the end cap 150). In some embodiments, the contoured region 230 may extend along part of the barrel portion 110 and into the tapered section 130.

In some embodiments, the contoured region 230 may be centered around a location C along the bat 200. The location C may be positioned in a high-performance region of the ball striking area 180. For example, the location C may coincide with the sweet spot 190 or another high-performance area of the bat 200. In other embodiments, the contoured region 230 may be positioned elsewhere along the bat 200. In some embodiments, the contoured region 230 is asymmetric relative to the location C, such that a first portion of the contoured region 230 on a first side of the location C is different from a second portion of the contoured region 230 on a second, opposing side of the location C. For example, the size, shape, and position of curving portions 235, 240, and of straight sections 250, on one side of the location C (toward the distal end 155, which is identified in FIGS. 1 and 2) may be different from those of the other side of the location C (toward the proximal end 145, which is identified in FIGS. 1 and 2).

The contoured region 230 differs from conventional bat walls at least in the sense that it facilitates improved optimization of weight, strength, or performance characteristics. For example, contoured regions 230 configured in accordance with embodiments of the present technology may provide reduced weight (for example, minimized weight) while providing performance or durability that complies with league or association rules or regulations. As described below, methods of making ball bats may include methods of determining the shape of the contoured region 230.

Figure 3:
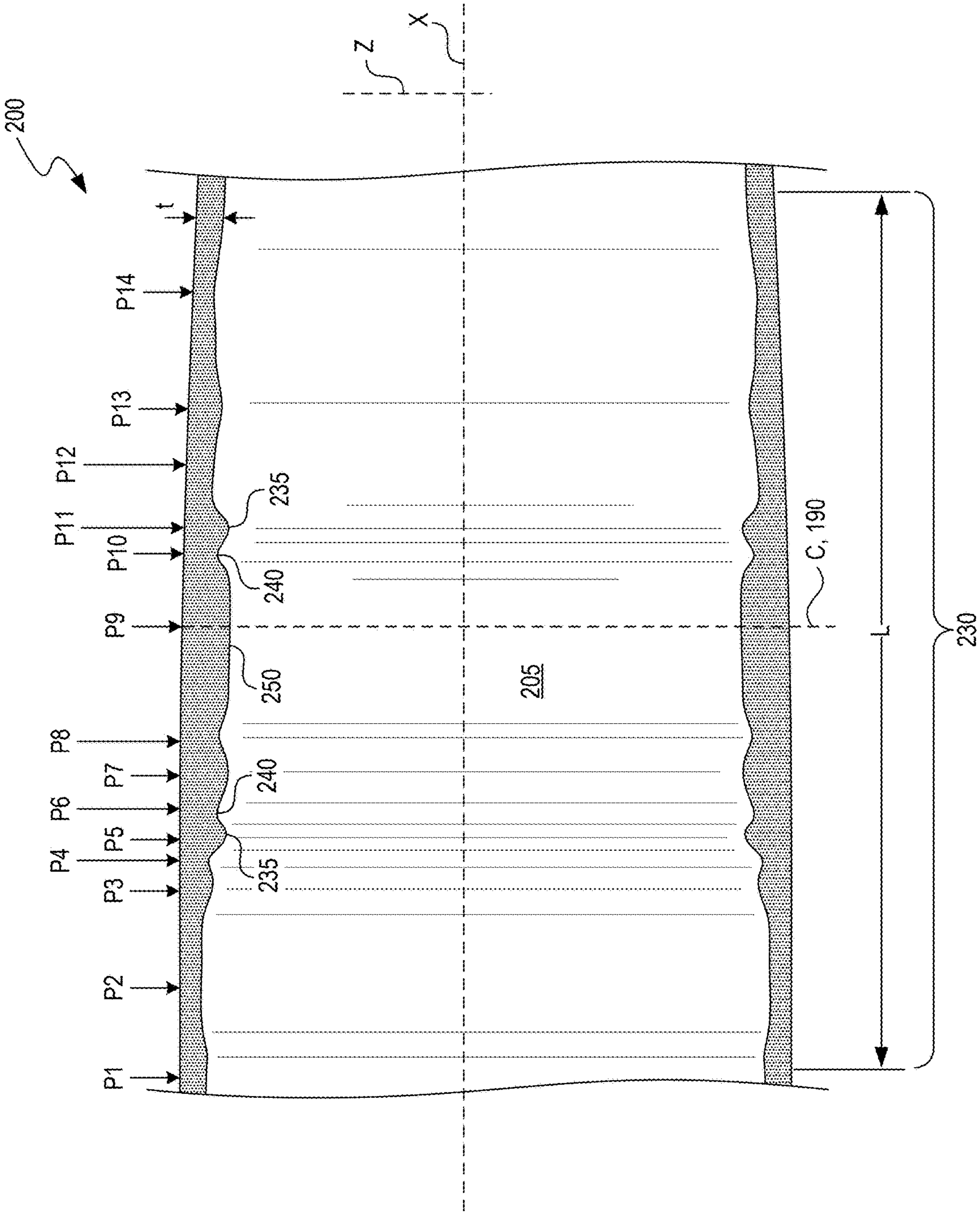
FIG. 3 illustrates a detailed side cross-sectional view of a contoured region of the bat shown in FIG. 2.

FIG. 3 illustrates a detailed cross-sectional view of the contoured region 230 shown in FIG. 2. In some embodiments, a wall thickness t may vary along the distance L as follows (values are in millimeters): at P1, 2.8; at P2, 2.3; at P3, 3.5; at P4, 3.0; at P5, 4.9; at P6, 3.9; at P7, 5.0; at P8, 4.1; at P9, 5.0; at P10, 3.5; at P11, 4.8; at P12, 2.9; at P13, 3.6; and at P14, 2.3. A representative thickness t in other locations may be 2.9 millimeters in some embodiments. In some embodiments, the locations P1 through P14 may be positioned at a distance from the centerline C as follows (values are in millimeters): P1 at 43.7; P2 at 36.3; P3 at 25.4; P4 at 23; P5 at 19.9; P6 at 17.9; P7 at 12.9; P8 at 9.7; P9 at 0 (center); P10 at 9.5; P11 at 12.5; P12 at 19.9; P13 at 25.4; and P14 at 38.6. In some embodiments, an overall distance L for the contoured region 230 may be approximately 87.6 millimeters.

Figure 4:
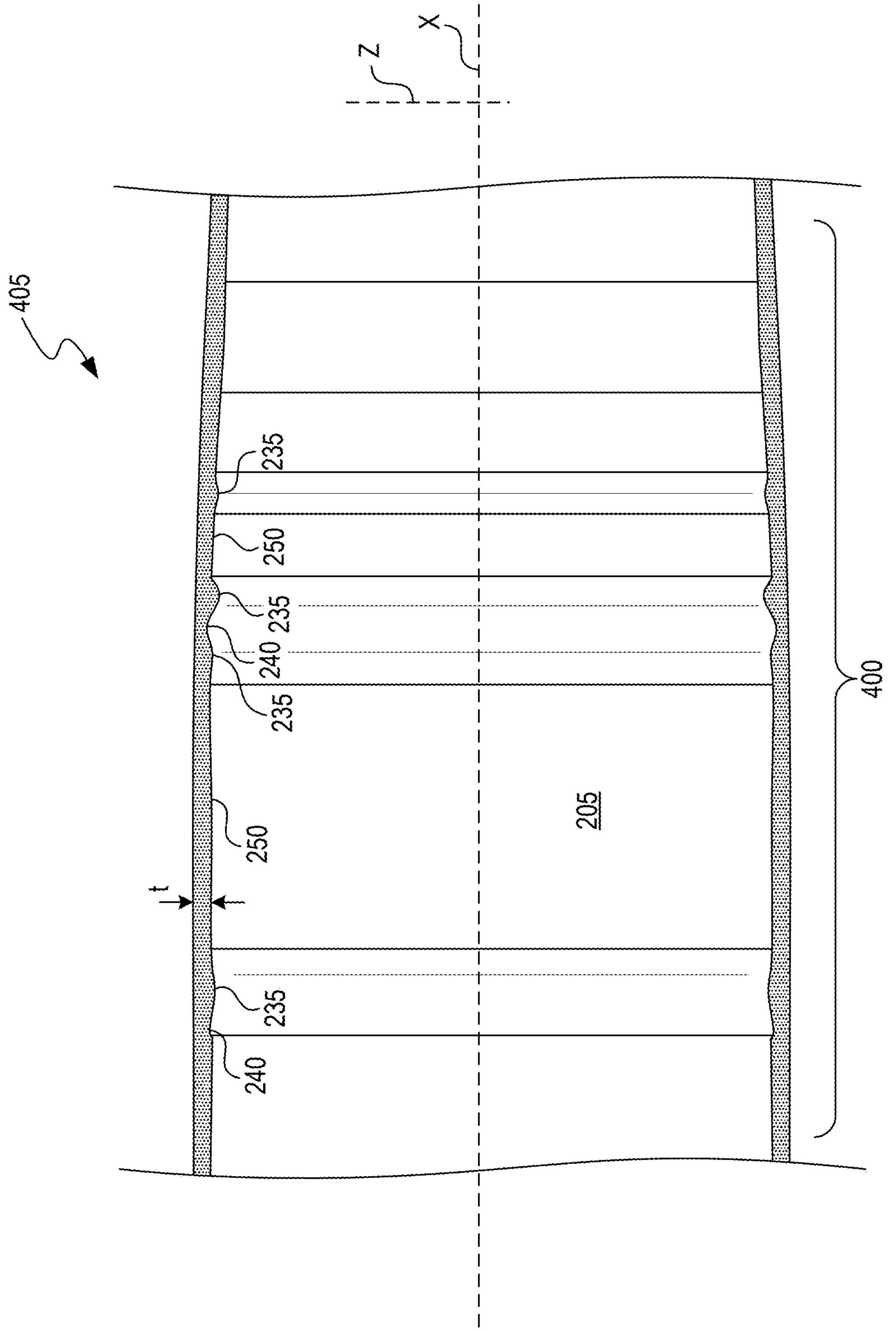
FIG. 4 illustrates a cross-sectional view of a contoured region in a bat configured in accordance with another embodiment of the present technology.

FIG. 4 illustrates a cross-sectional view of a contoured region 400 in a bat 405 configured in accordance with another embodiment of the present technology. The contoured region 400 may be similar to the contoured region 230 described above, and it may be implemented in a bat or ball striking area described above. The contoured region 400 may include a different quantity or configuration of curving portions 235, 240, inflection points 245, and straight sections 250. For example, the contoured region 400 may include four radially inwardly curving portions 235, two radially outwardly curving portions 240, and one or more straight sections 250 positioned between two of the curving portions 235, 240.

Figure 5:
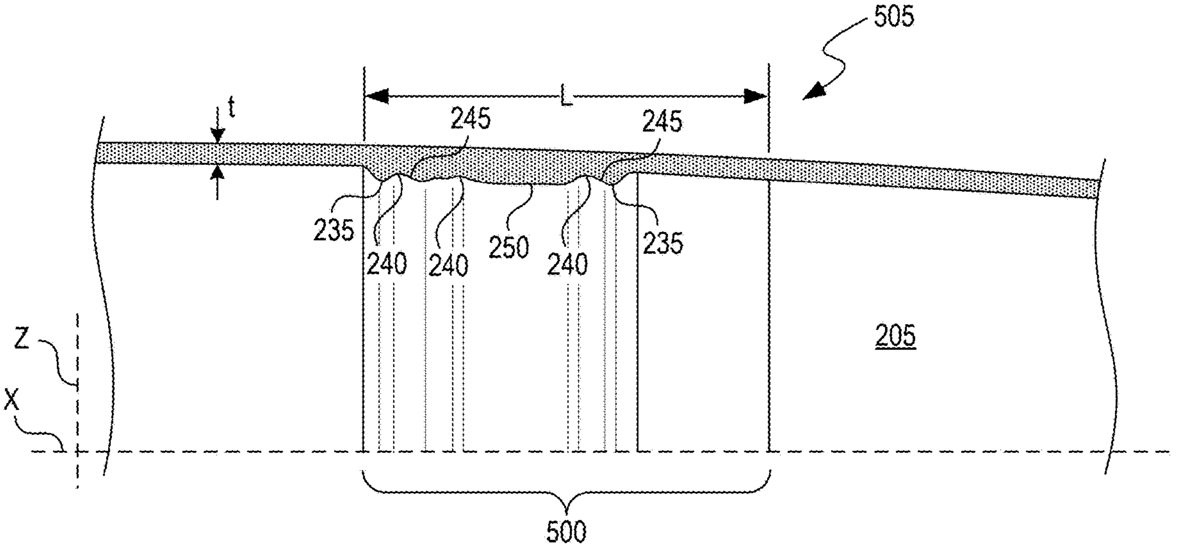
FIG. 5 illustrates a cross-sectional view of a contoured region in a bat configured in accordance with another embodiment of the present technology.

FIG. 5 illustrates a cross-sectional view of a contoured region 500 in a bat 505 configured in accordance with another embodiment of the present technology. The contoured region 500 may include a plurality of curving portions 235, 240 (with inflection points 245 therebetween) and one or more straight sections 250. In some embodiments, the distance L is approximately 1.5 inches, such as 1.544 inches, and the maximum wall thickness may be approximately 0.2 inches. Although only some curving portions 235, 240 and some inflection points 245 are labeled, in the illustrated embodiment there may be twelve inflection points with four radially outwardly curving portions 240. The inventors determined that the contoured region 500 may be particularly suitable for adult baseball.

Figure 6:
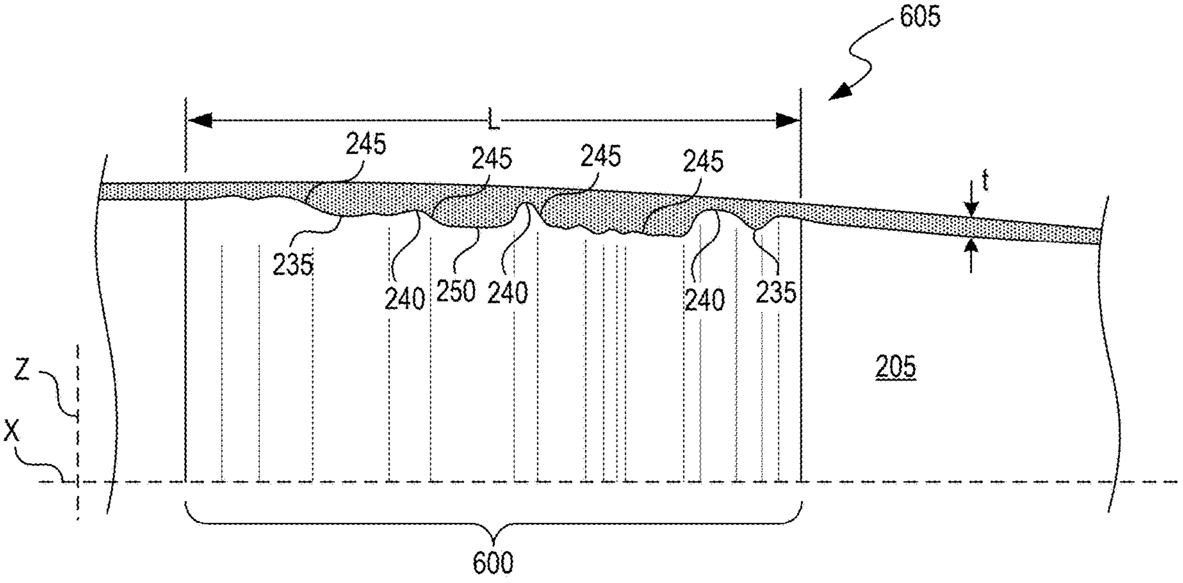
FIG. 6 illustrates a cross-sectional view of a contoured region in a bat configured in accordance with another embodiment of the present technology.

FIG. 6 illustrates a cross-sectional view of a contoured region 600 in a bat 605 configured in accordance with another embodiment of the present technology. The contoured region 600 may include a plurality of curving portions 235, 240 (with inflection points 245 therebetween) and one or more straight sections 250. In some embodiments, the distance L is approximately 3.5 inches, such as 3.543 inches, and the maximum wall thickness may be approximately 0.2 inches, such as 0.216 inches. Although only some curving portions 235, 240 and some inflection points 245 are labeled, in the illustrated embodiment there may be 21 inflection points with 9 radially outwardly curving portions 240. The inventors determined that the contoured region 600 may be particularly suitable for USA baseball.

Contoured regions may be designed and manufactured using computerized tools and methods according to embodiments of the present technology. For example, bats and contoured regions may be created using a generative design process that forms the contoured region according to performance parameters, such as how much energy the bat will impart to the ball. Embodiments of the present technology include a method for dynamically generating a bat design from a 3D computer model of at least a portion of a bat.

As described in additional detail below, the method may include executing a solver function of a computer-aided design (CAD) program to identify one or more possible final geometries for a new 3D body that do not penetrate a fixed obstacle region, and are modified from a starting geometry to (a) include less material than the starting geometry such that the one or more possible final geometries impart a reduced mass to the new 3D body that is within a mass target range; (b) can be manufactured in accordance with one or more manufacturing variables; and (c) conforms to displacement limits, a respective load at each one of multiple loading locations, and constraints associated with each respective load. The CAD program may be a commercial off the shelf program or group of programs that uses finite element analysis or other analysis tools to generate geometric solutions based on physical constraints, material constraints, and other constraints, such as the generative design features in Autodesk® computer-aided design software by Autodesk, Inc.

Figure 7:
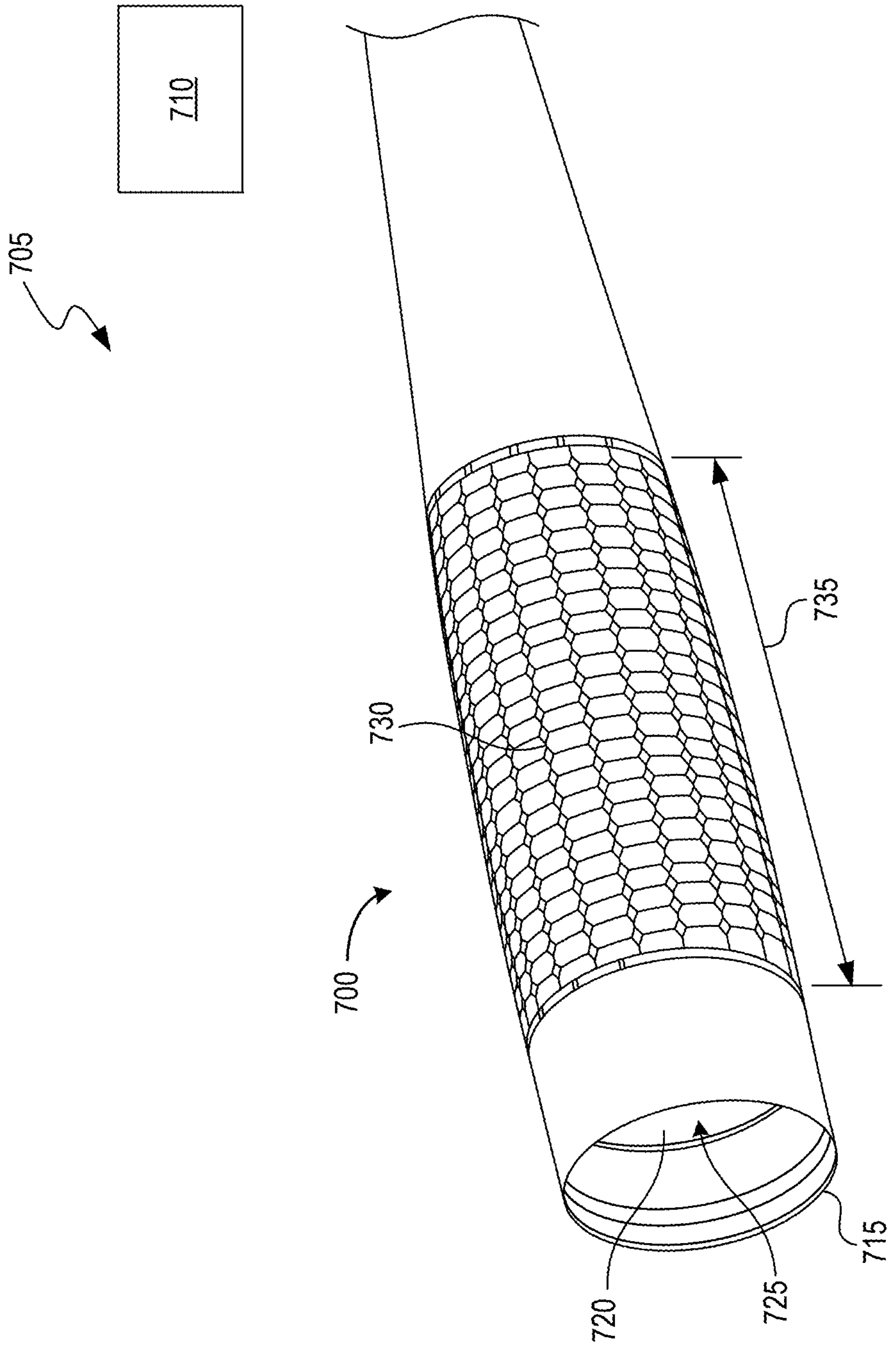
FIG. 7 illustrates a schematic diagram of a three-dimensional (3D) simulation model of a bat.

FIG. 7 illustrates a schematic diagram of a three-dimensional (3D) simulation model 700 of a bat 705 loaded into a CAD program running on a suitable programmable processor or controller 710. The CAD may be used to dynamically generate possible final geometries for the internal structure (contoured regions) that enable the bat 705 to have desired performance parameters such as: a final mass within a specified mass target range and manufacturing variables such as available manufacturing materials, or available manufacturing methods. In some embodiments, the simulation model 700 may include an outer cylindrical wall 715 of the bat 705, a new 3D body 720, a fixed obstacle region 725, and one or more defined loading conditions 730. In some embodiments, the new 3D body 720, the fixed obstacle region 725, and the defined loading conditions 730 may be contained within a simulation region 735 of the 3D simulation model 700.

In some embodiments, the new 3D body 720 may be a starting volume that a solver routine of an off-the-shelf CAD program works within to generate possible geometries for the internal structure (contoured regions). The new 3D body 720 has a thickness that will be reduced within the simulation to create the contoured region, so the CAD solution will not be thicker than the thickness of the new 3D body 720. In some embodiments, the fixed obstacle region 725 may include a volume from which material cannot be removed or to which material cannot be added by the solver program when generating the possible final geometries for the internal structure (contoured regions). In other words, the CAD solution cannot protrude into the fixed obstacle region 725. In further embodiments, the fixed obstacle region 725 may define a section of the bat 705 that must remain hollow or open when completed. The portions of the cylindrical wall 715 that are longitudinally outside of the simulation region 735 may include one or more preservation regions that have a minimum acceptable thickness to further reduce weight of the overall bat 705. The defined loading conditions 730 replicate desired compression values within the simulation region 735. The defined loading conditions 730 may be positioned at displacement targets where the simulation analyzes displacement from the loading conditions 730.

A person of ordinary skill in the art will understand how to use CAD software (including off-the-shelf CAD software) to carry out a method according to embodiments of the present technology. A representative method is more specifically illustrated and described below with respect to FIG. 8.

Figure 8:
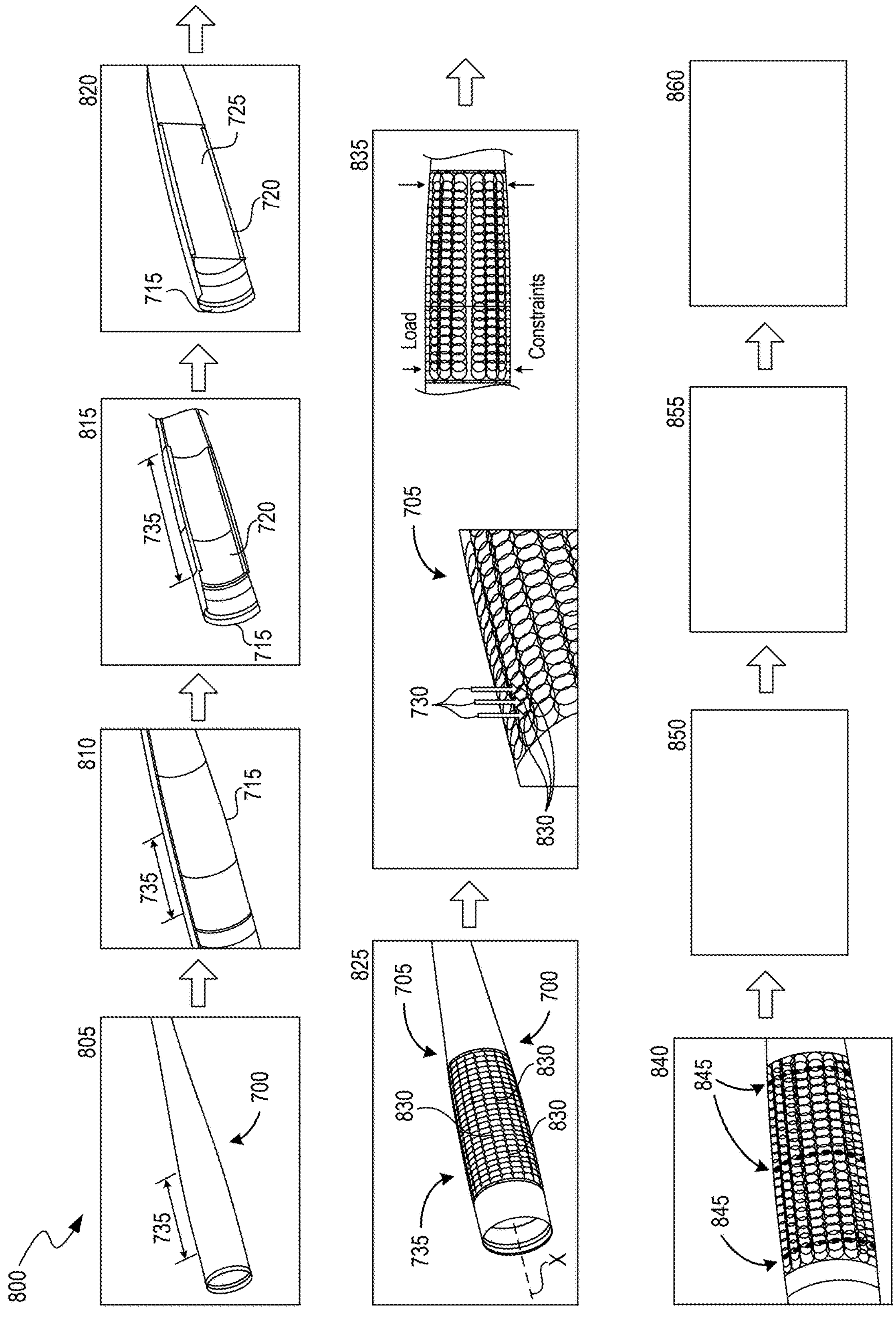
FIG. 8 is a flow diagram of a method of making ball bats configured in accordance with embodiments of the present technology.

FIG. 8 is a flow diagram of a method 800 of making ball bats configured in accordance with embodiments of the present technology. At block 805, the method may include loading the simulation model 700 into suitable CAD software and defining the simulation region 735. Then, at block 810, the method 800 may include selecting and setting a thickness of the outer cylindrical wall 715 to a minimum value within the simulation region 735. In some embodiments, the minimum value may correspond to a minimum acceptable manufacturing thickness or a minimum durability thickness, or another suitable thickness of the cylindrical wall 715. Next, at block 815, the method 800 may include generating the new 3D body 720 inside the simulation region 735. The new 3D body 720 may include a starting geometry, such as a relatively uniform cylinder shown in block 815. Next, at block 820, the method 800 may include generating the fixed obstacle region 725 relative to the new 3D body 720. In some embodiments, the fixed obstacle region 725 may be a cylindrical shape positioned concentrically within the new 3D body 720.

Next, at block 825, the method 800 may include defining loading locations 830 around the exterior of the simulation model 700 within the simulation region 735. In some embodiments, the loading locations 830 may include areas of the bat 705 that are conventionally used for compression testing in a lab environment. In some embodiments, the loading locations 830 may be distributed within the simulation region 735 in rows of loading locations 830. Within the rows, in some embodiments, adjacent loading locations 830 may be spaced apart from each other by approximately 0.25 inches along the longitudinal axis x. In some embodiments, the rows may be distributed around the circumference of the simulation region 735 with adjacent rows being 20 degrees from each other. The spacing of the loading locations 830 and rows of loading locations 830 may vary depending at least in part on the processing power and time constraints for generating the contoured regions.

Next, at block 835, the method 800 may include generating the loading conditions 730 by defining individual loads at each of the loading locations 830, along with corresponding constraints positioned on the opposite side of the bat 705 (circumferentially opposite the loading locations 830). In some embodiments, one constraint may be applied at the side of the bat 705 opposite from each loading location 830. In other embodiments, however, additional constraint locations may be included.

Next, at block 840, the method 800 may include defining displacement limits 845 for one or more of the loading locations 830. For example, in some embodiments, displacement limits may be defined at each end of the simulation region 735 and in the center of the simulation region 735, or in other suitable locations. The displacement limits help ensure that the displacement in the CAD model does not exceed an amount measured in lab testing.

In some embodiments, the loading conditions 730 may be applied at a center of the ball striking area 180, at a sweet spot, or along an entire face of the simulation region 735. In some embodiments, a distributed pressure may be applied to the simulation region 735.

Next, at block 850, the method may include receiving, at the computer or processor (via an input device such as a keyboard or a dataset), input corresponding to one or more design constraints, such as input defining the mass target range of the final bat 705 or of a portion of the bat 705, or one or more manufacturing variables such as manufacturing materials or methods (CNC, 3D printing, die casting, or other methods). At block 850, the constraints are applied to the model 700.

Next, at block 855, the method 800 may further include executing the CAD solver function to identify one or more possible final geometries (contoured regions) for the new 3D body 720 that do not penetrate the fixed obstacle region 725. In some embodiments, the one or more possible final geometries may be modified from the starting geometry of the new 3D body 720 to (a) include less material than the starting geometry such that the one or more possible final geometries impart a respective mass to the new 3D body 720 that is within the mass target range; (b) be manufactured in accordance with the one or more manufacturing variables; or (c) conform to the displacement limits, the respective load at each of the loading locations, and the constraints associated with each respective load. Part of identifying the possible final geometries may include the software determining how many inflection points 245 are in the possible final geometries, along with longitudinal and radial positions of the inflection points 245.

Then, at block 860, after the one or more possible final geometries are identified, the method 800 may further include reviewing the one or more possible final geometries for conformity or compliance with the mass target range or one or more manufacturing variables. The method may include further analyzing the possible final geometries in a CAD program to verify that the compression values of a bat 705 implementing the geometry (contoured region) meet the desired performance parameters associated with the compression values. In some embodiments, the method 800 may include applying manual alterations to one or more of the possible final geometries to further tailor them to requirements.

Figure 9:
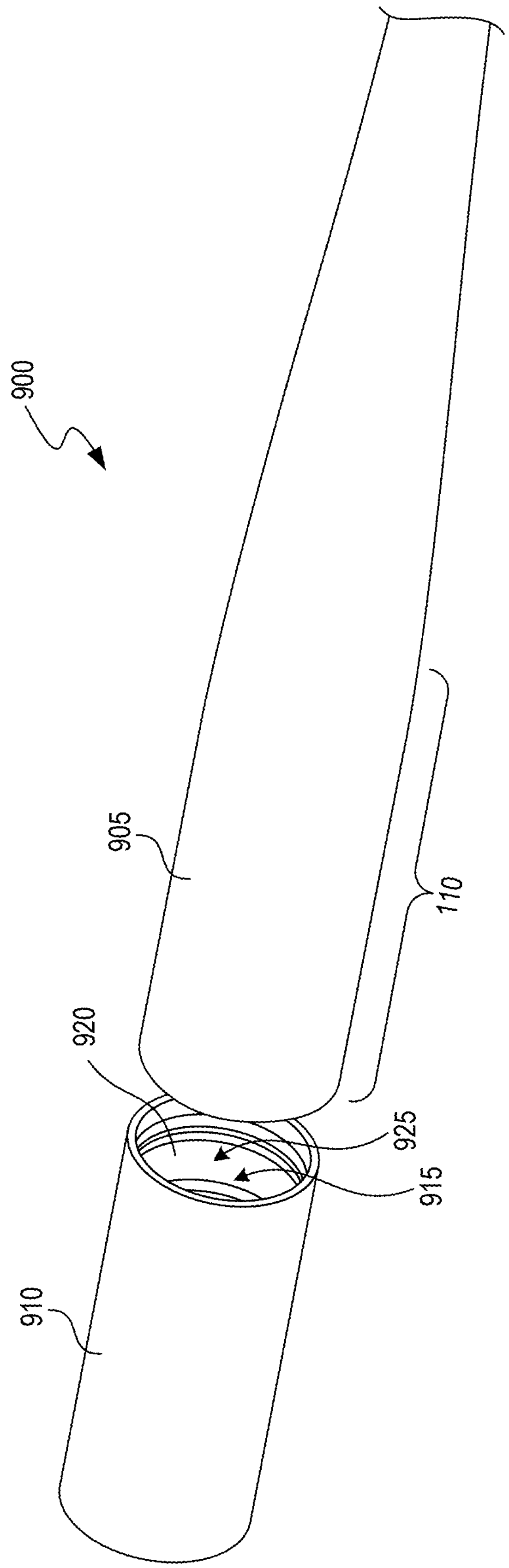
FIG. 9 illustrates a schematic perspective view of a portion of a ball bat configured in accordance with additional embodiments of the present technology.

FIG. 9 illustrates a schematic perspective view of a portion of a bat 900 configured in accordance with embodiments of the present technology. In some embodiments, the bat 900 may include a shell portion 905. The shell portion 905 may be generally hollow, and it may include at least the barrel portion 110 (see also, FIG. 1). In some embodiments, the bat 900 may further include an insert element 910 positioned and configured to be received in the shell portion 905. The insert element 910 may be press-fit, bonded, or otherwise fixed inside the shell portion 905 directly against an interior surface of the shell portion 905.

The insert element 910 may include a hollow interior region 915 similar to the hollow interior region 205 described above. The insert element 910 may include an inner surface 920 that is at least partially contoured, such that it has a contoured region 925 similar to one or more of the contoured regions described above. The contoured region 925 and the insert element 910 may be fabricated separately from the remainder of the bat 900 and then added to the overall assembly of the bat 900. Accordingly, in some embodiments, the contoured regions may be part of an insert element that is fixed in the shell portion 905. Some embodiments of the present technology may therefore be simpler to manufacture than bats that are formed to include the contoured regions directly in a barrel wall. However, in other embodiments, contoured regions may be integral to a barrel wall (such as in FIGS. 2-6), such that they are molded or machined into the barrel wall (for example, using a mandrel or other suitable manufacturing equipment).

Figure 10:
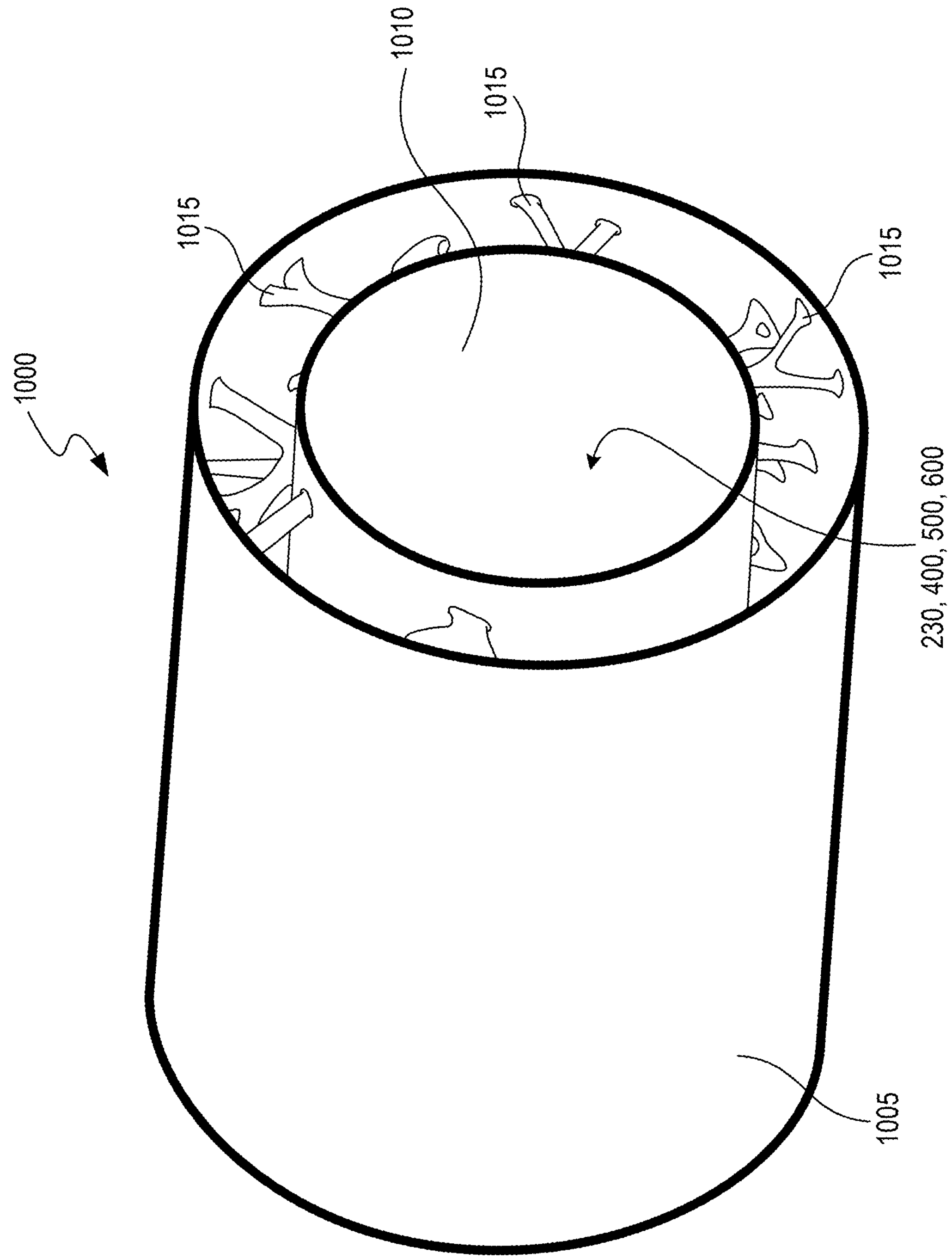
FIG. 10 illustrates a perspective cutaway view of a portion of a ball bat configured in accordance with additional embodiments of the present technology.

FIG. 10 illustrates a perspective cutaway view of a portion of a bat 1000 configured in accordance with embodiments of the present technology. Specifically, for some embodiments, the cutaway view in FIG. 10 may represent at least a portion of a ball striking area 180 (see FIG. 1). The bat 1000 may be a double-wall bat, such that instead of (or in addition to) having a contoured region, the bat 1000 may include an outer wall 1005, an inner wall 1010 positioned in the outer wall 1005, and a plurality of supporting struts 1015 positioned to support the inner wall 1010 within the outer wall 1005, essentially suspending the inner wall 1010 within the outer wall 1005. The struts 1015 may be designed in a CAD program or with other suitable tools. In some embodiments, the struts 1015 may be made using additive manufacturing (for example, "3D printing"). In some embodiments, the inner wall 1010 may include a contoured region, such as a contoured region 230, 400, 500, 600 described above, or another contoured region. In some embodiments, the inner wall 1010 may be the insert element 910 described above, but with a smaller overall diameter to accommodate the struts 1015 between the inner wall 1010 and the outer wall 1005.

FIG. 11 illustrates a chart 1100 of dimensions for a variety of ball bats configured in accordance with embodiments of the present technology. Each row represents a bat that includes a contoured region having a maximum wall thickness t (column 1105) and extending along a distance L (column 1110).

Specific details of several embodiments of the present technology are described herein with reference to ball bats. Embodiments of the present technology may be used in baseball, fast-pitch softball, slow-pitch softball, or other sports involving a projectile device or element such as a ball.

Ball bats configured in accordance with embodiments of the present technology provide several advantages. For example, they provide precise and optimized weight-reduction geometries for bat-wall structures that conform to laboratory-tested performance parameters or to designer-specified performance parameters.

Although specific dimensions are provided herein for some embodiments, other embodiments may include other suitable dimensions, and embodiments of the present technology are not limited to the specific dimensions disclosed herein.

From the foregoing, it will be appreciated that specific embodiments of the disclosed technology have been described for purposes of illustration, but that various modifications may be made without deviating from the technology, and elements of certain embodiments may be interchanged with those of other embodiments, and that some embodiments may omit some elements.

Many embodiments of the technology described herein may take the form of computer-executable or controller-executable instructions, including routines executed by a programmable computer or controller. Those skilled in the art will appreciate that the technology may be practiced on computer/controller systems other than those shown and described herein. The technology may be embodied in a special-purpose computer, controller, or data processor that is specifically programmed, configured, or constructed to perform one or more of the computer-executable instructions described herein. Accordingly, the terms "computer" and "controller," as generally used herein, refer to any suitable data processor and may include Internet appliances and hand-held devices (including palm-top computers, wearable computers, cellular or mobile phones, multiprocessor systems, processor-based or programmable consumer electronics, network computers, mini computers, and the like). Information handled by these computers may be presented at any suitable display medium, including an LCD.

The technology may also be practiced in distributed environments, where tasks or modules are performed by remote processing devices that are linked through a communications network (e.g., a wireless communication network, a wired communication network, a cellular communication network, the Internet, and/or a short-range radio network such as Bluetooth). In a distributed computing environment, program modules and/or subroutines may be located in local and remote memory storage devices. Aspects of the technology described herein may be stored and/or distributed on computer-readable media, including magnetic or optically readable or removable computer disks, as well as distributed electronically over networks. Data structures and transmissions of data particular to aspects of the technology are also encompassed within the scope of the embodiments of the technology.

While advantages associated with certain embodiments of the disclosed technology have been described in the context of those embodiments, other embodiments may also exhibit such advantages, and not all embodiments need to exhibit such advantages to fall within the scope of the technology. Accordingly, the disclosure and associated technology may encompass other embodiments not expressly shown or described herein.

What is claimed is:

1. A ball bat comprising:

a handle portion comprising a proximal end of the bat;

a barrel portion attached to or continuous with the handle portion along a longitudinal axis of the bat, wherein the barrel portion comprises a distal end of the bat;

a bat wall forming at least part of the barrel portion, wherein an inner surface of the bat wall has a contoured region; and a hollow region inside the bat wall; wherein:

the contoured region extends along the longitudinal axis by a distance;

the contoured region comprises a plurality of radially inwardly curving portions and a plurality of radially outwardly curving portions such that a thickness of the bat wall within the contoured region varies along the distance; and the radially inwardly curving portions and the radially outwardly curving portions are unevenly distributed within the contoured region.

2. The ball bat of claim 1, wherein the contoured region is centered around a sweet spot of the bat.

3. The ball bat of claim 1, wherein the contoured region is centered around a location along the bat, and wherein the contoured region is asymmetric relative to the location.

4. The ball bat of claim 1, further comprising one or more straight sections within the contoured region.

5. The ball bat of claim 1, wherein the contoured region extends along only part of the barrel portion.

6. The ball bat of claim 1, wherein the contoured region comprises ten or more inflection points between adjacent radially inwardly curving portions and radially outwardly curving portions, and wherein the inflection points are unevenly distributed within the contoured region along the longitudinal axis and along a radial axis perpendicular to the longitudinal axis.

7. The ball bat of claim 1, wherein the distance is between 1.5 inches and 4.0 inches.

8. The ball bat of claim 1, wherein the thickness of the bat wall within the contoured region varies between 0.09 inches and 0.25 inches.

9. The ball bat of claim 1, wherein the bat wall comprises a shell portion and an insert element positioned in, and attached to or press-fit in, the shell portion, and wherein the insert element comprises the contoured region.

10. The ball bat of claim 9, wherein the insert element is supported within the bat via a plurality of struts.

11. A ball bat comprising:

a handle portion comprising a proximal end of the bat; and a barrel portion attached to or continuous with the handle portion along a longitudinal axis of the bat, wherein the barrel portion comprises a distal end of the bat, and wherein the barrel portion comprises at least part of a bat wall having a contoured region with a wall thickness that varies along the longitudinal axis; wherein:

the contoured region comprises a plurality of radially inwardly curving portions and a plurality of radially outwardly curving portions;

the contoured region is longitudinally centered around a location in the barrel portion; and the contoured region is asymmetric relative to the location such that a first portion of the contoured region on a first side of the location is different from a second portion of the contoured region on a second side of the location opposite the first side of the location.

12. The ball bat of claim 11, wherein the wall thickness varies between 0.09 inches and 0.25 inches.

13. The ball bat of claim 11, further comprising one or more straight sections within the contoured region.

14. The ball bat of claim 11, wherein the contoured region extends along only part of the barrel portion.

15. The ball bat of claim 11, wherein the contoured region extends along the longitudinal axis by a distance between 1.5 inches and 4.0 inches, and wherein portions of the bat wall outside of the contoured region have uniform thickness.

16. The ball bat of claim 11, wherein the bat wall comprises a shell portion and an insert element positioned in, and attached to or press-fit in, the shell portion, and wherein the insert element comprises the contoured region.

17. The ball bat of claim 16, wherein the insert element is supported within the bat via a plurality of struts.

* * * * *